United States Patent
Zhou

(10) Patent No.: US 11,482,604 B2
(45) Date of Patent: *Oct. 25, 2022

(54) SEMICONDUCTOR STRUCTURE AND FORMATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 15 days.

This patent is subject to a terminal disclaimer.

(21) Appl. No.: 17/038,730

(22) Filed: Sep. 30, 2020

(65) Prior Publication Data

US 2021/0265471 A1    Aug. 26, 2021

(30) Foreign Application Priority Data

Feb. 26, 2020 (CN) .......................... 202010118576.3

(51) Int. Cl.
| | |
|---|---|
| *H01L 29/417* | (2006.01) |
| *H01L 29/06* | (2006.01) |
| *H01L 29/78* | (2006.01) |
| *H01L 21/8234* | (2006.01) |
| *H01L 29/66* | (2006.01) |

(52) U.S. Cl.
CPC ............. *H01L 29/41791* (2013.01); *H01L 21/823431* (2013.01); *H01L 29/0653* (2013.01); *H01L 29/66795* (2013.01); *H01L 29/785* (2013.01); *H01L 2029/7858* (2013.01)

(58) Field of Classification Search
CPC .......... H01L 29/41791; H01L 29/7827; H01L 29/0653; H01L 29/66795; H01L 29/0847; H01L 27/0886
See application file for complete search history.

(56) References Cited

U.S. PATENT DOCUMENTS

| | | | |
|---|---|---|---|
| 10,297,668 B1* | 5/2019 | Lee | H01L 21/823487 |
| 2010/0237436 A1* | 9/2010 | Inaba | H01L 27/0886 |
| | | | 257/392 |
| 2017/0117274 A1* | 4/2017 | Cai | H01L 29/6653 |
| 2020/0052090 A1* | 2/2020 | Hsiao | H01L 21/823821 |

* cited by examiner

*Primary Examiner* — Changhyun Yi
(74) *Attorney, Agent, or Firm* — Anova Law Group, PLLC

(57) ABSTRACT

Semiconductor structures and fabrication methods thereof are provided. The method may include providing a substrate; forming a doped source/drain layer on a surface of the substrate; forming a channel pillar on the doped source/drain layer; forming a work function layer on side and top surfaces of the channel pillar; and forming a first isolation layer on the doped source/drain layer. The first isolation layer is on a portion of a sidewall surface of the work function layer. The method also includes forming a gate electrode layer on a surface of the work function layer and a surface of the first isolation layer.

17 Claims, 4 Drawing Sheets

US 11,482,604 B2

SEMICONDUCTOR STRUCTURE AND FORMATION METHOD THEREOF

CROSS-REFERENCE TO RELATED APPLICATION

This application claims the priority of Chinese Patent Application No. 202010118576.3, filed on Feb. 26, 2020, the content of which is incorporated by reference in its entirety.

TECHNICAL FIELD

The present disclosure generally relates to the field of semiconductor manufacturing technology and, more particularly, relates to semiconductor structures and fabrication methods.

BACKGROUND

Fin field-effect transistors (FinFETs) are a type of emerging multi-gate devices. An FinFET generally includes a fin protruding from the surface of the semiconductor substrate, and a gate structure covering portions of the top surface and sidewall surface of the fin; and doped source/drain regions in the fin at both sides of the gate structure. In the conventional planar metal-oxide-semiconductor field-effect transistor (MOSFET) structure, the gate that controls the flow of current can only be controlled from one side of the gate structure to control the connection and disconnection of the current, and it belongs to a planar structure. In the FinFET structure, the gate structure is a fork-shaped 3D structure similar to a fish fin, which can control the "on" and "off" of the circuit from both sides of the fin. Such a design makes the FinFET to have stronger short-channel suppression ability, can improve circuit control and reduce leakage current, shorten the gate length of the transistor, and have a stronger operating current and better electrical control of the channel.

With the further development of semiconductor technology, the size of integrated circuit devices is getting smaller and smaller, and the traditional FinFETs have limitations in further increasing the operating current. In particular, since only the regions close to the top surface and the sidewall surface of the fin are used as the channel region, the volume used as the channel region in the fin is small, which causes restrictions for increasing the operating current of the FinFET. Therefore, FinFETs with gate-all-around (GAA) structures (GAA FinFETs) have been developed. The volume of the gate structures used as the channel regions of the GAA FinFETs is increased, and their channel areas are increased. Accordingly, the operating currents of the GAA FinFETs are increased.

However, there is still a need to further improve the performance of the GAA FinFETs. The disclosed methods and semiconductor structures are directed to solve one or more problems set forth above and other problems in the art.

SUMMARY

One aspect of the present disclosure provides a semiconductor structure. The semiconductor structure may include a substrate; a doped source/drain layer formed on the substrate; a channel pillar formed on the doped source/drain layer; a work function layer formed on a sidewall surface of the channel pillar; and a first isolation layer formed over the doped source/drain layer. The first isolation layer is on a portion of a sidewall surface of the work function layer. The semiconductor structure also includes a gate electrode layer formed on a surface of the work function layer and a surface of the first isolation layer.

Optionally, the work function layer may further include an extension portion over a surface of the substrate; and the first isolation layer may be on a sidewall surface of the extension portion.

Optionally, a top surface of the first isolation layer may be higher than a top surface of the extension portion of the work function layer.

Optionally, a thickness of the first isolation layer is in a range of approximately 2 nm-8 nm.

Optionally, a material of the first isolation layer includes one or more of silicon oxide, silicon nitride, silicon oxynitride, silicon oxynitride, silicon carbonitride, and silicon oxycarbonitride.

Optionally, the semiconductor structure may further include a second isolation layer over the doped source/drain layer. The second isolation layer is on a portion of the sidewall surface of the channel pillar; the work function layer is over the second isolation layer; and the first isolation layer on the second isolation layer.

Optionally, the semiconductor structure may also include a gate dielectric layer on the sidewall surface of the channel pillar; and the work function layer is on a surface of the gate dielectric layer.

Optionally, the semiconductor structure may also include a dielectric layer over the surface of the substrate, wherein the channel pillar is in the dielectric layer; and a first conductive plug, a second conductive plug and a third conductive plug in the dielectric layer. The first conductive plug is electrically connected to the gate electrode layer on the surface of the first isolation layer, the second conductive plug is electrically connected to a top of the channel pillar, and the third conductive plug is electrically connected to the doped source/drain layer.

Another aspect of the present disclosure provides a method for forming a semiconductor structure. The method may include providing a substrate; forming a doped source/drain layer on a surface of the substrate; forming a channel pillar on the doped source/drain layer; forming a work function layer over top and sidewall surfaces of the channel pillar; and forming a first isolation layer over the doped source/drain layer. The first isolation layer is over a portion of a sidewall surface of the work function layer. The method may also include forming a gate electrode layer over a surface of the work function layer and a surface of the first isolation layer.

Optionally, the work function layer may also include an extension portion over the surface of the substrate; and the first isolation layer is on a sidewall surface of the extension portion of the work function layer.

Optionally, forming the work function layer may include forming a work function material layer over the surface of the substrate and over the top and sidewall surfaces of the channel pillar; forming a mask structure on a portion of the work function material layer on the sidewall surface of the channel pillar; and etching the work function material layer using the mask structure as an etching mask until the surface of the substrate is exposed to form the work function layer.

Optionally, a top surface of the first isolation layer is higher than a top surface of the extension portion of the work function layer.

Optionally, forming the mask structure may include forming a mask material layer on the work function material layer; and etching back the mask material layer until the surface of the work function material layer is exposed to form the mask structure on the portion of the work function material layer on the sidewall surface of the channel pillar.

Optionally, a material of the mask structure may include one or more of silicon oxide, silicon nitride, silicon oxynitride, silicon carbonitride, and silicon oxycarbonitride.

Optionally, forming the first isolation layer may include forming an isolation material layer on the surface of the substrate and a sidewall surface of the mask structure; and etching back the isolation material layer to form the first isolation layer on the sidewall surface of the work function layer.

Optionally, a material of the first isolation layer may include one or more of silicon oxide, silicon nitride, silicon oxynitride, silicon carbonitride, and silicon oxycarbonitride; and a thickness of the first isolation layer is in a range of approximately 2 nm-8 nm.

Optionally forming the gate electrode layer may include forming a gate material layer over a surface of the first isolation layer and a surface of the work function layer; forming a patterned mask layer on the gate material layer to expose a portion of a surface of the gate material layer; and etching the gate material layer using the patterned mask layer as an etching mask until the surface of the first isolation layer is exposed to form the gate electrode layer.

Optionally, forming the work function layer may include forming a work function material layer on the surface of the substrate and the top and sidewall surfaces of the channel pillar; forming a patterned mask layer on the work function material layer to cover a portion of the work function material layer on a top surface of the channel pillar; and etching the work function material layer using the patterned mask layer as an etching mask until the surface of the substrate is exposed to form the work function layer on the top and sidewall surfaces of the channel pillar.

Optionally, the method further includes forming a second isolation layer on the doped source/drain layer; and forming a gate dielectric layer on the sidewall surface of the channel pillar. The second isolation layer is on a portion of a sidewall surface of the channel pillar; the work function layer is over the second isolation layer; the first isolation layer is on a surface of the second isolation layer; and the work function layer is on a surface of the gate dielectric layer.

Optionally, after forming the gate electrode layer, the method may also include forming a dielectric layer over the substrate, wherein the channel pillar is in the dielectric layer; and forming a first conductive plug, a second conductive plug and a third conductive plug in the dielectric layer, wherein the first conductive plug is electrically connected to the gate electrode layer on the surface of the first isolation layer, the second conductive plug is electrically connected to a top of the channel pillar, and the third conductive plug is electrically connected to the doped source/drain layer.

The present disclosure may have the following beneficial effects.

In the semiconductor structure provided by the present disclosure, the work function layer may be formed on the sidewall surface of the channel pillar, and a first isolation layer may be on a portion of the sidewall surface of the work function layer, and the gate electrode layer may be formed on the surface of the work function layer and the first isolation layer. The first isolation layer may isolate the gate electrode layer from the doped source/drain layer, and the first isolation layer may be located on the portion of the sidewall surface of the work function layer. Thus, the isolation distance between the gate electrode layer and the doped source/drain layer may be increased. Thus, the parasitic capacitance between the gate electrode layer and the doped source/drain layer 201 may be reduced. Accordingly, the operating current of the semiconductor structure may be increased, and the performance of the semiconductor structure may be improved.

Further, the work function layer may further include an extension portion, and the extension portion may be located over the surface of the substrate. The first isolation layer may be located on the sidewall surface of the extension portion. The extension portion may enable the mask structure used in the process of forming the work function layer to be located on the surface of the work function layer on the sidewall surface of the channel pillar. Thus, the mask structure may protect the work function layer on the sidewall surface of the channel pillar, and the damage from the process of forming the function layer may be avoided. The thickness uniformity of the work function layer may be improved; and the performance of the semiconductor structure may be improved.

Further, the top surface of the first isolation layer may be higher than the top surface of the extension portion, the thicker the thickness of the first isolation layer is, the greater the degree of the reduction of the parasitic capacitance between the gate electrode layer and the doped source/drain layer 201. Thus, the operating current of the semiconductor structure may be increased, and the performance of the semiconductor structure may be improved.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). The terms "surface," "on a surface," and/or "over a surface" in the present description are used to describe a spatial relationship and may include a direct contact and/or a non-direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

Figure 1:
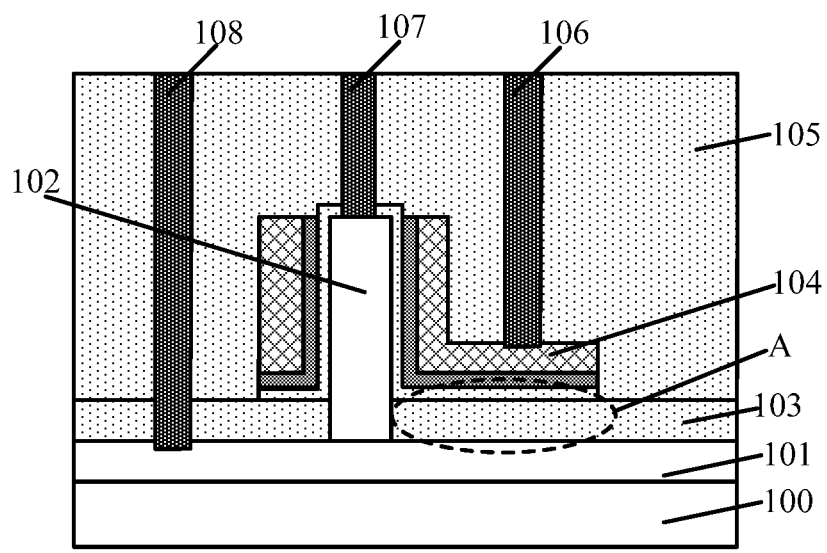
FIG. 1 illustrates a gate-all-around fin field-effect transistor (GAA FinFET)

FIG. 1 illustrates a vertical channel GAA FinFET. As shown in FIG. 1, the GAA FinFET includes a substrate 100; a doped source/drain layer 101 on the substrate 100; a channel pillar 102 on the doped source/drain layer 101; and an isolation layer 103 on a portion of the surface of the doped source/drain layer 101 and the sidewall surface of the channel pillar 102. The top surface of the isolation layer 103 is lower than the top surface of the channel pillar 102. Further, the GAA FinFET includes a gate structure 104 on the substrate 10. The gate structure includes a gate dielectric layer (not labeled), a work function layer (not labeled) on the gate dielectric layer, and a gate electrode layer (not labeled) on the work function layer. The gate structure includes a first portion and a second portion. The first portion is located on the sidewall surface of the channel pillar 102; and the second portion is located on the surface of the isolation layer 103 at one side of the channel pillar 102. Further, the GAA FinFET includes a dielectric layer 105 on the substrate 100. The gate structure is located in the dielectric layer 105. Further, the GAA FinFET includes a first conductive structure 106, a second conductive structure 107 and a third conductive structure 108 in the dielectric layer 105. The first conductive structure 106 is electrically connected to the gate electrode layer located in the second portion of the gate structure. The second conductive structure 107 is electrically connected to the top of the channel pillar 102, and the third conductive structure 108 is electrically connected to the doped source/drain layer 101.

In the vertical channel GAA FinFET, because the first conductive structure 106 needs to be electrically connected to the gate electrode layer, limited by the structure of the vertical channel GAA FinFET and the process of the first conductive structure 106, the first conductive structure 106 cannot be formed on the surface of the gate electrode layer on the sidewall surface of the channel pillar 102. Thus, the structure design of the transistor makes the second portion of the gate structure to be located on the surface of the isolation layer 103 at one side of the channel pillar 102 to facilitate the electrical connection between the first conductive structure 106 and the gate electrode layer. The isolation layer 103 may be formed on the surface of the doped source/drain layer 101. The doped source/drain doped layer 101 has charged ions. The material of the gate electrode layer includes metal, and the material of the work function layer is conductive material. Thus, a parasitic capacitance is generated between the doped source/drain layer 101 and the second portion of the gate structure, as shown in area "A" in FIG. 1. Accordingly, the current of the transistor becomes smaller; and the response speed of the transistor becomes slow; and the performance of the transistor is adversely affected.

The present disclosure provides a semiconductor structure and a method for forming a semiconductor structure. A work function layer may be formed on the sidewall surface and the top surface of the channel pillar, and then a first isolation layer may be formed on the substrate. The first isolation layer may be formed on a portion of the sidewall surface of the work function layer. Then, a gate electrode layer may be formed on the substrate, and the gate electrode layer may be formed on the surface of the work function layer and the surface of the first isolation layer. The semiconductor structure formed by such a method may increase the isolation distance between the gate electrode layer and the doped source/drain layer such that the parasitic capacitance between the gate electrode layer and the doped source/drain doped layer may be reduced. As a result, the operating current of the semiconductor structure may be increased, and the performance of the semiconductor structure may be improved.

To make the above objectives, features and beneficial effects of the present disclosure more obvious and understandable, specific embodiments of the present disclosure will be described in detail below with reference to the accompanying drawings.

Figure 7:
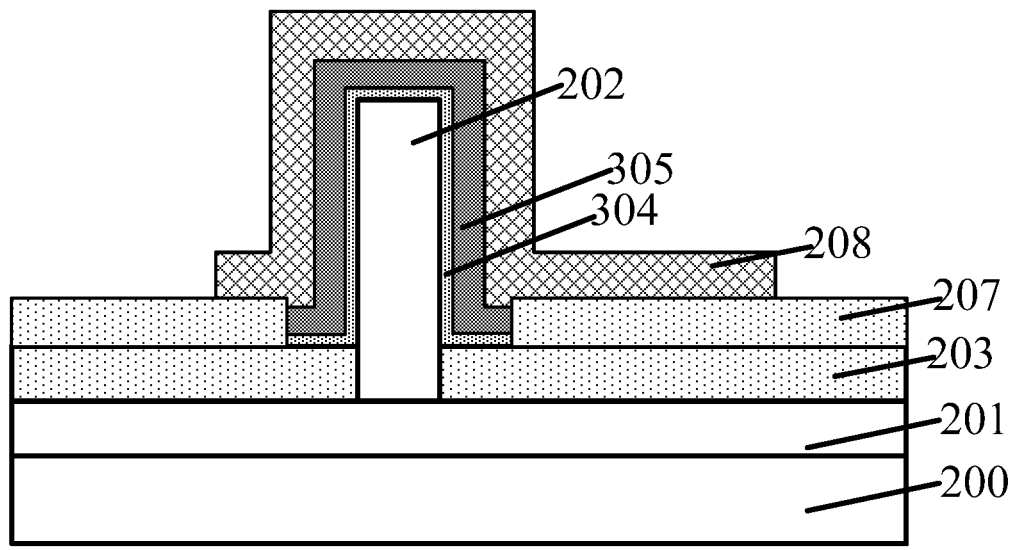
Figure 8:
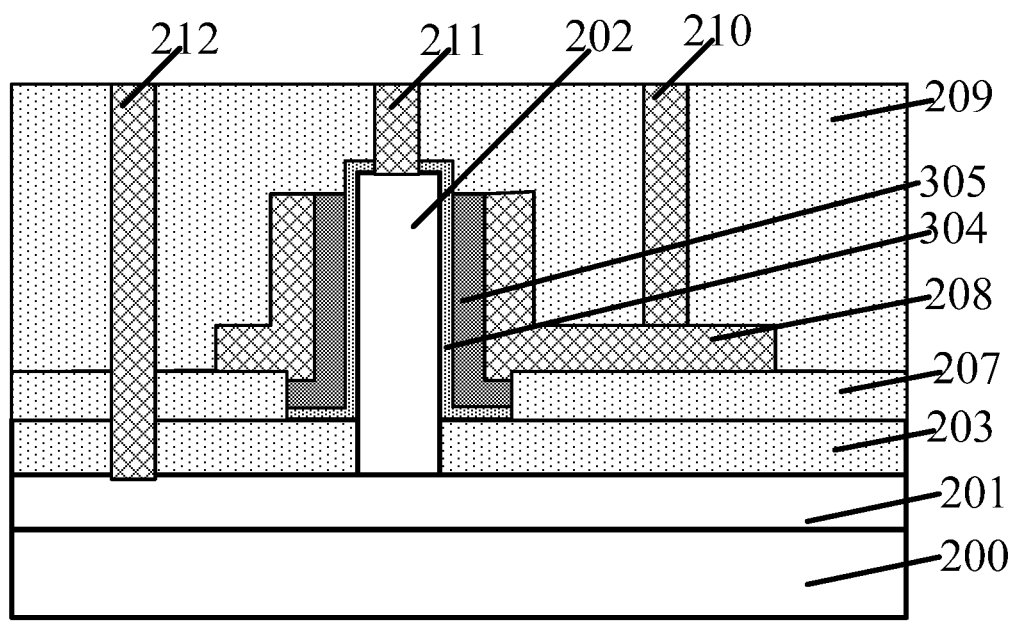
Figure 9:
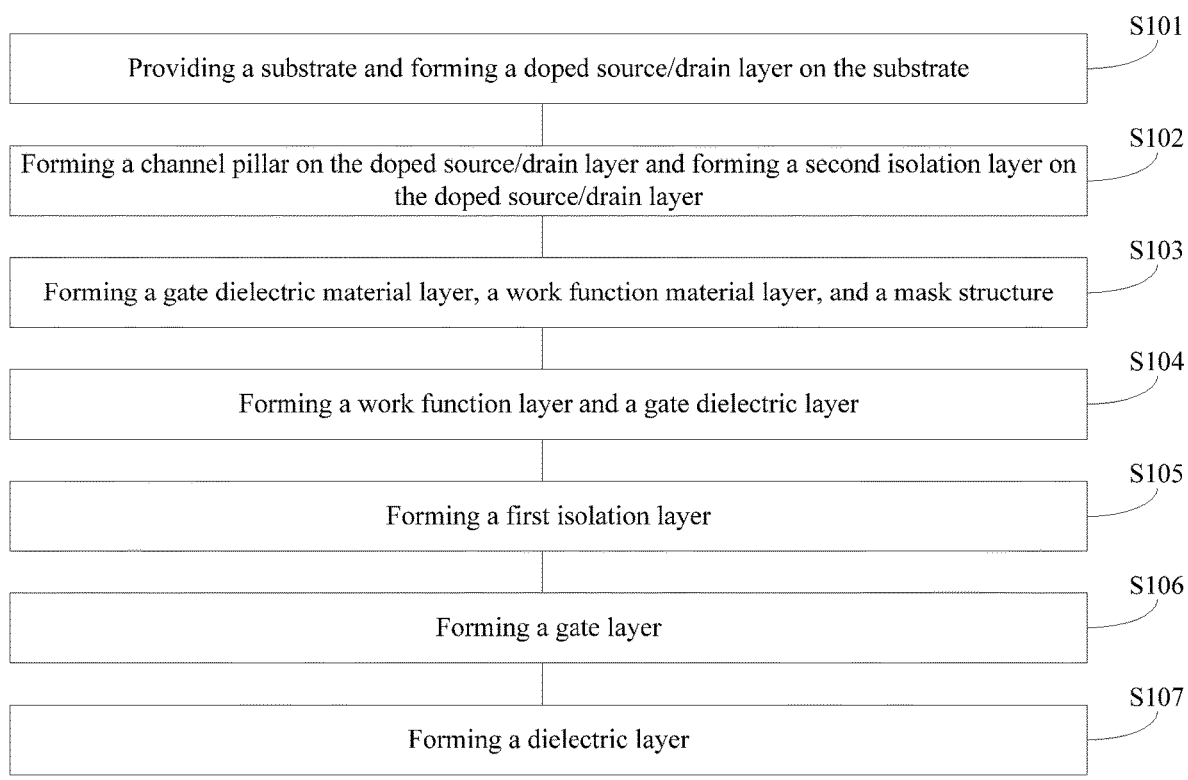
FIG. 9 illustrates an exemplary fabrication process of a semiconductor structure consistent with various disclosed embodiments of the present disclosure.

FIG. 9 illustrates an exemplary fabrication process of a semiconductor structure consistent with various disclosures of the present disclosure. FIGS. 2-8 illustrate structures corresponding to certain stages during the exemplary fabrication process of the semiconductor structure.

Figure 2:
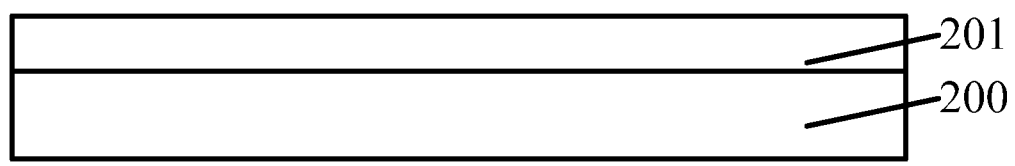
FIGS. 2-8 illustrate structures corresponding to certain stages during an exemplary fabrication process of a semiconductor structure consistent with various disclosed embodiments of the present disclosure.

As shown in FIG. 9, at the beginning of the fabrication process, a substrate with certain structures is provided (S101). FIG. 2 illustrates a corresponding structure.

As shown in FIG. 2, a substrate 200 is provided, and a doped source/drain layer 201 may be formed on the substrate 200.

The doped source/drain layer 201 may contain doping ions. The type of the doping ion may be N-type or P-type. The N-type ions may include phosphorous ions, or arsenic ions, etc.; and the P-type ions may include boron ions, or indium ions, etc.

In one embodiment, the formation process of the doped source/drain layer 201 may include an ion implantation process. In some embodiments, the formation process of the doped source/drain layer may include an in-situ doping process, etc.

In one embodiment, the material of the substrate 200 is single crystalline silicon. In some embodiments, the substrate may also be other semiconductor material, such as polysilicon, germanium, silicon germanium, gallium arsenide, or silicon-on-insulator, etc.

Figure 3:
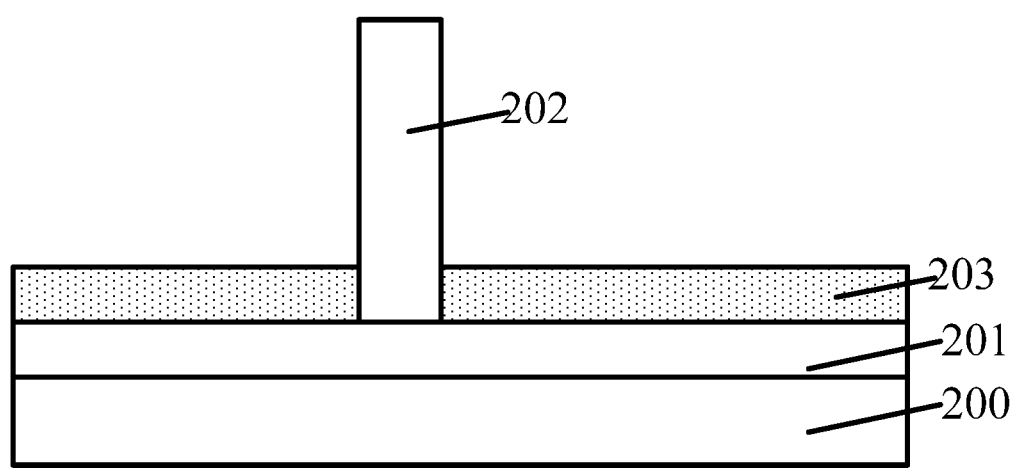

Returning to FIG. 9, after forming the doped source/drain layer, a channel pillar 202 may be formed (S102). FIG. 3 illustrates a corresponding structure.

As shown in FIG. 3, a channel pillar 202 may be formed on the doped source/drain layer 201.

The method for forming the channel pillar 202 may include forming a channel material layer (not shown) on the substrate 200; forming a patterned mask layer (not shown) on the surface of the channel material layer by exposing a portion of the surface of the channel material layer; and etching the channel material layer using the patterned mask layer as a mask until the surface of the doped source/drain layer 201 is exposed. Thus, the channel pillar 202 may be formed on the doped source/drain layer 201.

In one embodiment, the material of the channel pillar 202 may include silicon. In some embodiments, the material of the channel pillar may include other semiconductor material, such as germanium, silicon germanium, or gallium arsenide, etc.

The process for etching the channel material layer may include a dry etching process, or a wet etching process, etc. The process for forming the channel material layer may be a physical vapor deposition (PVD) process, an epitaxial growth process, or an atomic layer deposition (ALD) process, etc.

In one embodiment, the process for etching the channel material layer includes a dry etching process. The dry etching process may form a channel pillar 202 with a desired sidewall topography. The process for forming the channel material layer may include a physical vapor deposition (PVD) process. The PVD process may form a dense and thick channel material layer.

In one embodiment, the material of the patterned mask layer may include photoresist. The process for forming the patterned mask layer may include a spin coating process, etc.

In some embodiments, the patterned mask layer may include a hard mask layer and a photoresist layer on the hard mask layer. The material of the hard mask layer may include silicon oxide, or silicon nitride, etc.

After forming the channel pillar 202, the patterned mask layer may be removed. In one embodiment, the process for removing the patterned mask layer may include an ashing process.

Further, referring to FIG. 3, a second isolation layer 203 may be formed on the surface of the doped source/drain layer 201. The second isolation layer 203 may be formed on a portion of the sidewall surface of the channel pillar 202, and the top surface of the second isolation layer 203 may be lower than the top surface of the channel pillar 202. The second isolation layer 203 may be used to electrically isolate devices.

The method for forming the second isolation layer 203 may include forming an isolation material layer (not shown) on the substrate 200; and etching back the isolation material layer to form the second isolation layer 203.

The material of the second isolation layer 203 may include silicon oxide, silicon nitride, silicon oxynitride, or silicon carbonitride, etc. The process for forming the isolation material layer may be a chemical vapor deposition (CVD) process, an atomic layer deposition (ALD) process, or a heat treatment process, etc.

In one embodiment, the material of the second isolation layer 203 may include silicon oxide. The process for forming the isolation material layer may include a chemical vapor deposition (CVD) process. The CVD process may be able to form a dense and thick layer of insulating material.

After forming the second isolation layer, a gate dielectric layer may be formed on the sidewall surface and the top surface of the channel pillar 202, and a work function layer may be formed on the gate dielectric layer.

In one embodiment, the gate dielectric layer and the work function layer may further include extension portions, and the extension portions may be located over the surface of the second isolation layer 203.

In other embodiments, the gate dielectric layer and the work function layer may not include extension portions.

Figure 4:
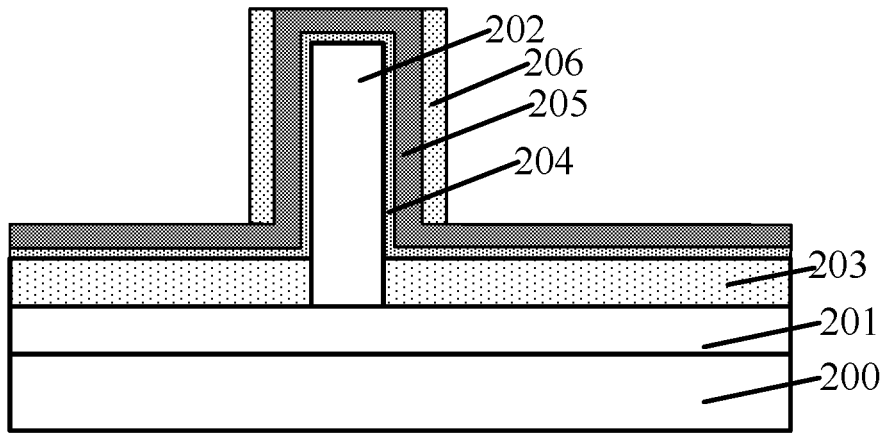

Returning to FIG. 9, after forming the second isolation layer, a gate dielectric material layer, a work function material layer, and a mask structure may be formed (S103). FIG. 4 illustrates a corresponding structure.

As shown in FIG. 4, a gate dielectric material layer 204 may be formed on the surface of the substrate 200, the top surface and the sidewall surface of the channel pillar 202; a work function material layer 205 may be formed on the surface of the gate dielectric material layer 204; and a mask structure 206 may be formed on the surface of the work function material layer 205.

After forming the work function material layer 205, the mask structure 206 may be formed on the portion of the surface of the work function material layer 205 on the sidewall surface of the channel pillar 202. Thus, the top surface of the subsequently formed first isolation layer may be higher than the top surface of the extension portion of the work function layer; and the gate electrode layer may be subsequently formed on the surface of the first isolation layer. Accordingly, the increase of the distance between the doped source/drain layer 201 and the gate channel caused by the work function material layer 205 also being formed on the surface of the first isolation layer may be avoided, and the increase of the resistance of the semiconductor structure may be avoided.

The method for forming the mask structure 206 may include forming a mask material layer (not shown) on the surface of the work function material layer 205; etching back the mask material layer until the surface of the work function material layer 205 is exposed to form the mask structure 206 on the surface of the work function material layer 205 on the portion of the sidewall surface of the channel pillar 202.

The material of the mask structure 206 may include one or more of silicon oxide, silicon nitride, silicon oxynitride, silicon oxynitride, and silicon oxynitride, etc. The process for forming the mask material layer may include a chemical vapor deposition (CVD) process, an atomic layer deposition (ALD) process, or a heat treatment process, etc.

In one embodiment, the material of the mask structure 206 may include silicon nitride. The process for forming the mask material layer may include an atomic layer deposition (ALD) process. The ALD process may be able to form a mask material layer with a dense and uniform structure, and a relatively small thickness.

The mask structure 206 may be formed on the surface of the work function material layer 205 on the sidewall surface of the channel pillar 202; and the mask structure 206 may protect the work function material layer 205 on the sidewall surface of the channel pillar 202. The damage to the work function material layer 205 on the sidewall surface of the channel pillar 202 during subsequently etching the work function material layer 205 and the gate dielectric material layer 204 may be avoided. Thus, the thickness uniformity of the subsequently formed work function layer may be improved; and the performance of the semiconductor structure may be enhanced.

The work function material layer 205 may provide a material layer for subsequently forming the work function layer on the sidewall surface of the channel pillar 202 and the surface of the second isolation layer 203.

The material of the work function material layer 205 may include a P-type work function material or an N-type work function material. The P-type work function material may include titanium nitride, or tantalum nitride, etc. The N-type work function material may include titanium aluminum, etc.

The process for forming the work function material layer 205 may be an atomic layer deposition (ALD) process, a chemical vapor deposition (CVD) process, or a physical vapor deposition (PVD) process, etc. In one embodiment, the process for forming the work function material layer 205 may include an atomic layer deposition (ALD) process. The ALD process may form a work function material layer 205 with a large thickness, a uniform film thickness, and a dense structure.

The material of the gate dielectric layer 204 may include a high-K (K is greater than 3.9) dielectric material. The high-K dielectric material may include hafnium oxide, or aluminum oxide, etc. The process for forming the gate dielectric layer 204 may include an atomic layer deposition (ALD) process, a chemical vapor deposition (CVD) process, or a heat treatment process, etc. In one embodiment, the process for forming the gate dielectric layer 204 includes an atomic layer deposition (ALD) process. The ALD process may form the gate dielectric layer 204 with a dense structure and a relatively small thickness.

Figure 5:
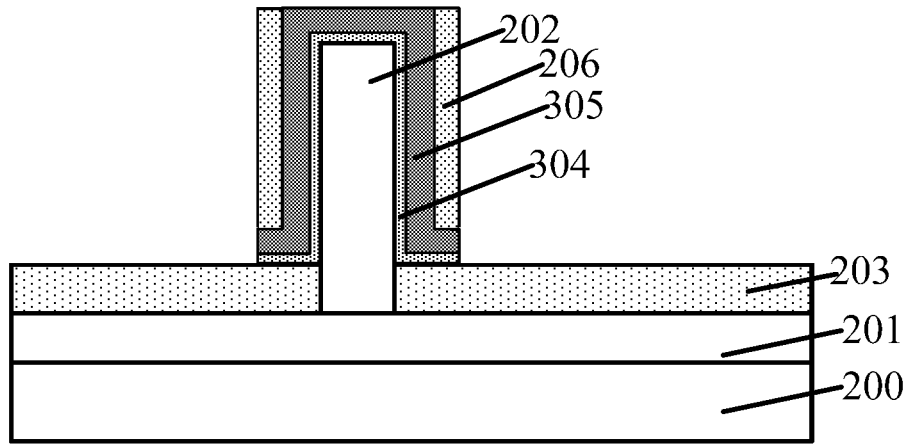

Returning to FIG. 9, after forming the work function material layer, the gate dielectric material layer and the mask structure, a work function layer and a gate dielectric layer may be formed (S104). FIG. 5 illustrates a corresponding structure.

As shown in FIG. 5, the work function material layer 205 and the gate dielectric material layer 204 may be etched using the mask structure 206 as a mask until the surface of the second isolation layer 203 is exposed to form a gate dielectric layer 304 and a work function layer 305. The gate dielectric layer 304 and the work function layer 305 may include extension portions (not labeled) on the second isolation layer 203.

The process for etching the work function material layer 205 and the gate dielectric material layer 204 may be one or more of a dry etching process and a wet etching process, etc.

In one embodiment, the process for etching the work function material layer 205 and the gate dielectric material layer 204 may include a dry etching process. The dry etching process may form extension portions of the work function layer 305 and the gate dielectric layer 304 with desired sidewall morphologies.

The mask structure 206 may be located on the surface of the work function material layer 205 on the sidewall surface of the channel pillar 202. Thus, the mask structure 206 may protect the work function material layer 205 on the sidewall surface of the channel pillar 202, and the damage to the portion of the work function material layer 205 on the sidewall surface of the channel pillar 202 during the process for etching the work function material layer 205 and the gate dielectric material layer 204 may be avoided. Thus, the thickness uniformity of the formed work function layer 305 may be improved, and the performance of the semiconductor structure may be improved.

Figure 6:
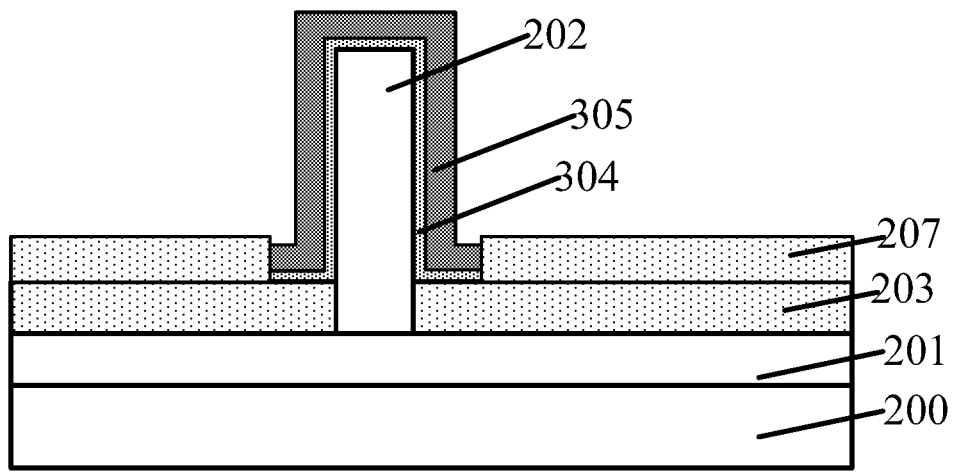

Returning to FIG. 9, after forming the work function layer and the gate dielectric layer, a first isolation layer may be formed (S105). FIG. 6 illustrates a corresponding structure.

As shown in FIG. 6, a first isolation layer 207 may be formed over the substrate 200. In particular, the first isolation layer 207 may be formed on the second isolation layer 203. The first isolation layer 207 may be located on the sidewall surfaces of the extension portions of the work function layer 305 and the gate dielectric layer 304. The top surface of the first isolation layer 207 may be lower than the top surface of the channel pillar 202.

The method for forming the first isolation layer 207 may include forming an isolation material layer (not shown) on the substrate 200 and the sidewall surface of the mask structure 206; and etching back the isolation material layer to form the first isolation layer 207 on the sidewall surface of the extension portions of the work function layer 305 and the gate dielectric layer 304.

The first isolation layer 207 may isolate the gate electrode layer subsequently formed on the surface of the first isolation layer 207 from the doped source/drain layer 201. At the same time, the first isolation layer 207 may be located on the sidewall surfaces of the extension portions of the work function layer 305 and the gate dielectric layer 304, the isolation distance between the subsequently formed gate electrode layer and the doped source/drain layer 201 may be increased. Thus, the parasitic capacitance between the subsequently formed gate electrode layer and the doped source/drain layer 201 may be reduced. Accordingly, the operating current of the semiconductor structure may be increased, and the performance of the semiconductor structure may be enhanced.

The material of the first isolation layer 207 may include one or more of silicon oxide, silicon nitride, silicon oxynitride, silicon oxynitride, and silicon oxynitride, etc. The process for forming the isolation material layer may include a chemical vapor deposition (CVD) process, an atomic layer deposition (ALD) process, or a heat treatment process, etc.

In one embodiment, the material of the first isolation layer 207 may include silicon oxide; and the process for forming the isolation material layer may include a chemical vapor deposition (CVD) process. The CVD process may form a dense and thick layer of insulating material.

The top surface of the first isolation layer 207 may be higher than or may level with the top surface of the extension portion of the work function layer 305. In one embodiment, the top surface of the first isolation layer 207 is higher than the top surface of the extension portion of the work function layer 305.

If the top surface of the first isolation layer 207 is higher than the top surface of the extension portion of the work function layer 305, the thickness of the first isolation layer 207 may be relatively large. On the one hand, the thicker the thickness of the first isolation layer 207 is, the greater the degree of reduction of the parasitic capacitance between the subsequently formed gate electrode layer and the doped source/drain layer 201 is. Accordingly, the operating current of the semiconductor structure may be increased; and the performance of the semiconductor structure may be increased.

The thickness of the first isolation layer 207 may be in range of approximately 2 nm to 8 nm. If the thickness of the first isolation layer 207 is too large, in particular, greater than 8 nm, the gate electrode layer subsequently formed on the surface of the first isolation layer 207 may have a weaker control on the channel region, which may not facilitate to improve of the performance of the semiconductor structure. If the thickness of the first isolation layer 207 is too small, in particular, less than 2 nm, the degree of reduction of the parasitic capacitance between the gate electrode layer subsequently formed on the surface of the first isolation layer 207 and the doped source/drain layer 201 may not be obvious. Thus, the isolation layer 207 may not play a desired role. The first isolation layer 207 with a thickness ranging from 2 nm to 8 nm may minimize the parasitic capacitance between the gate electrode layer and the doped source/drain doped layer 201, and the control ability of the gate electrode layer on the channel region may not be weakened. Accordingly, the performance of the semiconductor structure may be improved.

Further, referring to FIG. 6, after forming the first isolation layer 20, the mask structure 206 may be removed.

The process for removing the mask structure 206 may include one or more of a dry etching process, and a wet etching process, etc. In one embodiment, the process for removing the mask structure 206 may include a wet etching process. The wet etching process may be able to completely remove the mask structure 206 on the surface of the work function layer 305; and the adverse effect to the performance of the gate electrode layer subsequently formed on the surface of the work function layer 305 caused by the uncomplete removal of the mask structure 206 may be avoided.

Returning to FIG. 9, after removing the mask structure, a gate electrode layer may be formed (S106). FIG. 7 illustrates a corresponding structure.

As shown in FIG. 7, a gate electrode layer 208 may be formed on the surface of the work function layer 305 and the surface of the first isolation layer 207.

The method for forming the gate electrode layer 208 may include forming a gate material layer (not shown) on the surface of the first isolation layer 207 and the surface of the work function layer 305; and forming a patterned layer on the gate material layer to expose portions of the surface of the gate material layer on the first isolation layer 207; and etching the gate material layer using the patterned mask layer as an etching mask until the surface of the first isolation layer 207 is exposed to form the gate electrode layer 208.

The material of the gate electrode layer 208 may include a metal material, and the metal material may include copper, tungsten, or aluminum, etc. The process for forming the gate material layer may include a physical vapor deposition (PVD) process, or an electroplating process, etc. The process for etching the gate material layer may include one or more of a dry etching process and a wet etching process, etc.

In one embodiment, the material of the gate electrode layer 208 may include tungsten; the process for forming the gate material layer may include a physical vapor deposition (PVD) process; and the process for etching the gate material layer may include a dry etching process. The dry etching process may be able to form the gate electrode layer 208 with a desired sidewall topography.

The gate electrode layer 208 may be located on the surface of the work function layer 305 and the surface of the first isolation layer 207. The first isolation layer 207 may isolate the gate electrode layer 208 from the doped source/drain layer 201. The isolation layer 207 may be located on the sidewall surface of the extension portions of the work function layer 305 and the gate dielectric layer 304. Thus, the isolation distance between the gate electrode layer 208 and the doped source/drain doped layer 201 may be increased; and the parasitic capacitance between the gate electrode layer 208 and the doped source/drain layer 201 may be reduced. Accordingly, the operating current of the semiconductor structure may be increased, and the performance of the semiconductor structure may be improved.

Returning to FIG. 9, after forming the gate electrode layer, a dielectric layer may be formed (S107). FIG. 8 illustrates a corresponding structure.

As shown in FIG. 8, a dielectric layer 209 may be formed over the substrate 200, and the channel pillar 202 may be located in the dielectric layer 209. A first conductive plug 210, a second conductive plug 211, and a third conductive plug 212 may be formed in the dielectric layer 209. The first conductive plug 210 may be electrically connected to the gate electrode layer 208 on the surface of the first isolation layer 207, and the second conductive plug 211 may be electrically connected to the top of the channel pillar 202, and the third conductive plug 212 may be electrically connected to the doped source/drain layer 201.

The method for forming the dielectric layer 209 may include forming a dielectric material layer (not shown) on the substrate 200 by covering the top surface of the channel pillar 202; and planarizing the dielectric material layer to form the dielectric layer 209.

The material of the dielectric layer 209 may include silicon oxide, silicon nitride, silicon oxynitride, or silicon carbonitride, etc. The process for forming the dielectric material layer may include a chemical vapor deposition (CVD) process, an atomic layer deposition (ALD) process, or a heat treatment process, etc.

In one embodiment, the material of the dielectric layer 209 may include silicon oxide; the process for forming the dielectric material layer may include a chemical vapor deposition (CVD) process. The CVD process may quickly form a thick and dense dielectric material layer.

The material of the first conductive plug 210, the second conductive plug 211, and the third conductive plug 212 may include a metal material. The metal material may include one or a combination of copper, tungsten, aluminum, and titanium nitride, etc.

Thus, in the semiconductor structure formed by the present disclosed method, the isolation distance between the gate electrode layer 208 and the doped source/drain layer 201 may be increased. Accordingly, the parasitic capacitance between the gate electrode layer 208 and the doped source/drain layer 201 may be reduced. Accordingly, the operating current of the semiconductor structure may be increased, and the performance of the semiconductor structure may be improved.

The present disclosure also provides a semiconductor structure. FIG. 8 illustrates an exemplary semiconductor structure consistent with various disclosed embodiments of the present disclosure.

As shown in FIG. 8, the semiconductor structure includes a substrate 200 and a doped source/drain layer 201 on the substrate 200. Further, the semiconductor structure may include a channel pillar 202 formed on the doped source/drain doped layer 201; and a work function layer 305 formed over the sidewall surface of the channel pillar 202. Further, the semiconductor structure may include a first isolation layer 207 formed over the substrate 200. The first isolation layer 207 may be located on a portion of the sidewall surface of the work function layer 305, and the top surface of the first isolation layer 207 may be lower than the top surface of the channel pillar 202. Further, the semiconductor structure may include a gate electrode layer 208 formed over the surface of the work function layer 305 and the surface of the first isolation layer 207.

In one embodiment, the work function layer 305 may further include an extension portion located over the surface of the substrate 200; and the first isolation layer 207 may be located on the sidewall surface of the extension portion of the work function layer 205.

In one embodiment, the top surface of the first isolation layer 207 may be higher than the top surface of the extension portion of the work function layer.

In one embodiment, the thickness of the first isolation layer 207 may be in range of approximately 2 nm to 8 nm.

In one embodiment, the material of the first isolation layer 207 may include one or a combination of silicon oxide, silicon nitride, silicon oxynitride, silicon oxynitride, and silicon oxynitride, etc.

In one embodiment, the semiconductor structure may further include a second isolation layer 203 on the doped source/drain layer 201. The second isolation layer 203 may be located on a portion of the sidewall surface of the channel pillar 202. The work function layer 305 may be located over the second isolation layer 203, and the first isolation layer 207 may be located on the surface of the second isolation layer 203.

In one embodiment, the semiconductor structure may further include a gate dielectric layer 304 on the sidewall surface of the channel pillar 202. The work function layer 305 may be formed on the surface of the gate dielectric layer 304.

In one embodiment, the semiconductor structure may further include a dielectric layer 209 formed over the substrate 200. The channel pillar 202 may be located in the dielectric layer 209. Further, the semiconductor structure may include a first conductive plug 210, a second conductive plug 211, and a third conductive plug 212. The first conductive plug 210 may be electrically connected to the gate electrode layer 208 on the surface of the first isolation layer 207; the second conductive plug 211 may be electrically connected to the top of the channel the pillar 202; and the third conductive plug 212 may be electrically connected to the doped source/drain layer 201.

In the semiconductor structure, the first isolation layer 207 may isolate the gate electrode layer 208 from the doped source/drain layer 201, and the first isolation layer 207 may be located on the sidewall surfaces of the extension portions of the work function layer 305 and the gate dielectric layer 304. Thus, the isolation distance between the gate electrode layer 208 and the doped source/drain layer 201 may be increased. Thus, the parasitic capacitance between the gate electrode layer 208 and the doped source/drain layer 201 may be reduced. Accordingly, the operating current of the semiconductor structure may be increased, and the performance of the semiconductor structure may be improved.

Further, the work function layer 305 may further include an extension portion, and the extension portion may be located over the surface of the second isolation layer 203. The first isolation layer 207 may be located on the sidewall surface of the extension portion of the work function layer 305. The extension portion may enable the mask structure used in the process of forming the work function layer to be located on the surface of the work function layer on the sidewall surface of the channel pillar. Thus, the mask structure may protect the work function layer on the sidewall surface of the channel pillar, and the damage from the process of forming the function layer may be avoided. The thickness uniformity of the work function layer may be improved; and the performance of the semiconductor structure may be improved.

Further, the top surface of the first isolation layer 207 may be higher than the top surface of the extension portion, the thicker the thickness of the first isolation layer 207 is, the greater the degree of reduction of the parasitic capacitance between the gate electrode layer 208 and the doped source/drain layer 201 is. Thus, the operating current of the semiconductor structure may be increased, and the performance of the semiconductor structure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
   a substrate;
   a doped source/drain layer formed on the substrate;
   a channel pillar formed on the doped source/drain layer;
   a work function layer having a first portion conformally formed on a top surface and sidewall surfaces of the channel pillar and an extension portion horizontally formed on a top surface of substrate connecting with the first portion;
   a first isolation layer formed over the doped source/drain layer, wherein the first isolation layer completely covers a sidewall surface of the extension portion of the work function layer;
   a gate electrode layer formed over a surface of the work function layer and a surface of the first isolation layer,
   a dielectric layer over the surface of the substrate, wherein the channel pillar is in the dielectric layer; and
   a first conductive plug, a second conductive plug and a third conductive plug, in the dielectric layer, wherein the first conductive plug is electrically connected to the gate electrode layer on the surface of the first isolation layer, the second conductive plug is electrically connected to a top of the channel pillar, and the third conductive plug is electrically connected to the doped source/drain layer.

2. The semiconductor structure according to claim 1, wherein:
   a top surface of the first isolation layer is higher than a top surface of the extension portion of the work function layer.

3. The semiconductor structure according to claim 1, wherein:
   a thickness of the first isolation layer is in a range of approximately 2 nm-8 nm.

4. The semiconductor structure according to claim 1, wherein:
   a material of the first isolation layer includes one or more of silicon oxide, silicon nitride, silicon oxynitride, silicon oxynitride, silicon carbonitride, and silicon oxycarbonitride.

5. The semiconductor structure according to claim 1, further comprising:
   a second isolation layer on the doped source/drain layer, wherein:
   the second isolation layer is over a portion of the sidewall surface of the channel pillar;
   the work function layer is over the second isolation layer; and
   the first isolation layer is on the second isolation layer.

6. The semiconductor structure according to claim 1, further comprising:
   a gate dielectric layer on the sidewall surface of the channel pillar,
   wherein the work function layer is on a surface of the gate dielectric layer.

7. The semiconductor structure according to claim 1, wherein:
   the gate electrode layer conformally covers a top surface and sidewall surfaces of the first portion of the work function layer, a top surface of the extension portion of the work function layer, a top surface of the first isolation layer, and a portion of a sidewall surface of the first isolation layer.

8. A method for forming a semiconductor structure, comprising:
   providing a substrate;
   forming a doped source/drain layer on a surface of the substrate;
   forming a channel pillar on the doped source/drain layer;
   forming a work function layer having a first portion conformally over a top and sidewall surfaces of the channel pillar and an extension portion horizontally formed on a top surface of substrate connecting with the first portion;
   forming a first isolation layer over the doped source/drain layer, wherein the first isolation layer completely covers a sidewall surface of the extension portion of the work function layer;
   forming a gate electrode layer over a surface of the work function layer and a surface of the first isolation layer;

forming a dielectric layer over the substrate, wherein the channel pillar is in the dielectric layer; and forming a first conductive plug, a second conductive plug and a third conductive plug in the dielectric layer, wherein the first conductive plug is electrically connected to the gate electrode layer on the surface of the first isolation layer, the second conductive plug is electrically connected to a top of the channel pillar, and the third conductive plug is electrically connected to the doped source/drain layer.

9. The method according to claim 8, wherein:
a top surface of the first isolation layer is higher than a top surface of the extension portion of the work function layer.

10. The method according to claim 8, wherein:
a material of the first isolation layer includes one or more of silicon oxide, silicon nitride, silicon oxynitride, silicon carbonitride, and silicon oxycarbonitride; and
a thickness of the first isolation layer is in a range of approximately 2 nm-8 nm.

11. The method according to claim 8, wherein forming the gate electrode layer comprises:
forming a gate material layer over a surface of the first isolation layer and a surface of the work function layer;
forming a patterned mask layer on the gate material layer to expose a portion of a surface of the gate material layer; and
etching the gate material layer using the patterned mask layer as an etching mask until the surface of the first isolation layer is exposed to form the gate electrode layer.

12. The method according to claim 8, wherein forming the work function layer comprises:
forming a work function material layer on the surface of the substrate and the top and sidewall surfaces of the channel pillar;
forming a patterned mask layer on the work function material layer to cover a portion of the work function material layer on a top surface of the channel pillar; and
etching the work function material layer using the patterned mask layer as an etching mask until the surface of the substrate is exposed to form the work function layer on the top and sidewall surfaces of the channel pillar.

13. The method according to claim 8, further comprising:
forming a second isolation layer on the doped source/drain layer; and
forming a gate dielectric layer on the sidewall surface of the channel pillar, and wherein:
the second isolation layer is on a portion of a sidewall surface of the channel pillar;
the work function layer is over the second isolation layer;
the first isolation layer is on a surface of the second isolation layer; and
the work function layer is on a surface of the gate dielectric layer.

14. A method for forming a semiconductor structure, comprising:
providing a substrate;
forming a doped source/drain layer on a surface of the substrate;
forming a channel pillar on the doped source/drain layer;
forming a work function layer having a first portion conformally over a top and sidewall surfaces of the channel pillar and an extension portion horizontally formed on a top surface of substrate connecting with the first portion, wherein forming the work function layer comprises:
forming a work function material layer over the surface of the substrate and over the top and sidewall surfaces of the channel pillar;
forming a mask structure on a portion of the work function material layer on the sidewall surface of the channel pillar; and
etching the work function material layer using the mask structure as an etching mask until the surface of the substrate is exposed to form the work function layer;
forming a first isolation layer over the doped source/drain layer, wherein the first isolation layer completely covers a sidewall surface of the extension portion of the work function layer; and
forming a gate electrode layer over a surface of the work function layer and a surface of the first isolation layer.

15. The method according to claim 14, wherein forming the mask structure comprises:
forming a mask material layer on the work function material layer; and
etching back the mask material layer until the surface of the work function material layer is exposed to form the mask structure on the portion of the work function material layer on the sidewall surface of the channel pillar.

16. The method according to claim 14, wherein:
a material of the mask structure includes one or more of silicon oxide, silicon nitride, silicon oxynitride, silicon carbonitride, and silicon oxycarbonitride.

17. The method according to claim 14, wherein forming the first isolation layer comprises:
forming an isolation material layer on the surface of the substrate and a sidewall surface of the mask structure; and
etching back the isolation material layer to form the first isolation layer on the sidewall surface of the work function layer.

* * * * *